US007718324B2

United States Patent
Hayashi et al.

(10) Patent No.: US 7,718,324 B2
(45) Date of Patent: **\*May 18, 2010**

(54) REFLECTIVE MASK BLANK FOR EUV LITHOGRAPHY

(75) Inventors: Kazuyuki Hayashi, Chiyoda-ku (JP);
Kazuo Kadowaki, Chiyoda-ku (JP);
Takashi Sugiyama, Chiyoda-ku (JP)

(73) Assignee: Asahi Glass Company, Limited, Tokyo (JP)

( \* ) Notice: Subject to any disclaimer, the term of this patent is extended or adjusted under 35 U.S.C. 154(b) by 51 days.

This patent is subject to a terminal disclaimer.

(21) Appl. No.: 12/028,250

(22) Filed: Feb. 8, 2008

(65) Prior Publication Data
US 2008/0182183 A1    Jul. 31, 2008

Related U.S. Application Data

(63) Continuation of application No. PCT/JP2008/050380, filed on Jan. 15, 2008.

(30) Foreign Application Priority Data
Jan. 31, 2007    (JP) ............................. 2007-021092

(51) Int. Cl.
*G03F 1/00*    (2006.01)
(52) U.S. Cl. ........................................... 430/5; 430/323
(58) Field of Classification Search .................. 430/5, 430/311, 323; 216/54, 58; 428/209, 210
See application file for complete search history.

(56) References Cited

U.S. PATENT DOCUMENTS

| 5,052,033 | A | 9/1991 | Ikeda et al. |
| 5,153,898 | A | 10/1992 | Suzuki et al. |
| 5,641,593 | A | 6/1997 | Watanabe et al. |
| 5,928,817 | A | 7/1999 | Yan et al. |
| 6,013,399 | A | 1/2000 | Nguyen |
| 6,352,803 | B1 | 3/2002 | Tong et al. |
| 6,355,381 | B1 | 3/2002 | Yan et al. |

(Continued)

FOREIGN PATENT DOCUMENTS

EP    1 973 147    9/2008

(Continued)

OTHER PUBLICATIONS

U.S. Appl. No. 12/205,967, filed Sep. 8, 2008, Hayashi, et al.

(Continued)

*Primary Examiner*—Mark F Huff
*Assistant Examiner*—Stewart A Fraser
(74) *Attorney, Agent, or Firm*—Oblon, Spivak, McClelland, Maier & Neustadt, L.L.P.

(57) ABSTRACT

A reflective mask blank for EUV lithography, which comprises a substrate, and a reflective layer to reflect EUV light and an absorber layer to absorb EUV light, formed in this order on the substrate, wherein the absorber layer contains tantalum (Ta) and hafnium (Hf), and in the absorber layer, the content of Hf is from 20 to 60 at. % and the content of Ta is from 40 to 80 at. %, and wherein the absorber layer has a content of N being 0 to at most 35 at. %.

29 Claims, 1 Drawing Sheet

U.S. PATENT DOCUMENTS

| | | | |
|---|---|---|---|
| 6,395,455 | B2 | 5/2002 | Gianoulakis et al. |
| 6,410,193 | B1 | 6/2002 | Stivers et al. |
| 6,479,195 | B1 | 11/2002 | Kirchauer et al. |
| 6,506,526 | B2 | 1/2003 | Stivers et al. |
| 6,593,037 | B1 | 7/2003 | Gabriel et al. |
| 6,610,447 | B2 | 8/2003 | Yan et al. |
| 6,627,362 | B2 | 9/2003 | Stivers et al. |
| 6,645,679 | B1 | 11/2003 | La Fontaine et al. |
| 6,673,520 | B2 | 1/2004 | Han et al. |
| 6,720,118 | B2 | 4/2004 | Yan et al. |
| 7,348,105 | B2 | 3/2008 | Ishibashi et al. |
| 2002/0142230 | A1 | 10/2002 | Yan et al. |
| 2003/0180631 | A1* | 9/2003 | Shiota et al. .................. 430/5 |
| 2005/0208389 | A1 | 9/2005 | Ishibashi et al. |
| 2005/0244722 | A1* | 11/2005 | Okada et al. .................. 430/5 |
| 2006/0251973 | A1 | 11/2006 | Takaki et al. |
| 2008/0199787 | A1* | 8/2008 | Hayashi et al. ................ 430/5 |

FOREIGN PATENT DOCUMENTS

| | | |
|---|---|---|
| JP | 2004-6798 | 1/2004 |
| JP | 2004-6799 | 1/2004 |
| JP | 2005-208282 | 8/2005 |
| JP | 2007-273514 | 10/2007 |

OTHER PUBLICATIONS

C. W. Gwyn, et al., "Extreme Ultraviolet Lithography", J. Vac. Sci. Technol. B 16(6), Nov./Dec. 1998, pp. 3142-3149.

Pei-yang Yan, et al., "TaN EUVL Mask Fabrication and Characterization", Proceedings of SPIE, vol. 4343, 2001, pp. 409-414.

M. Takahashi, et al., "Smooth, low-stress, sputtered tantalum and tantalum alloy films for the absorber material of reflective-type EUVL", Proceedings of SPIE, vol. 3997, 2000, pp. 484-495.

U.S. Appl. No. 12/034,319, filed Feb. 20, 2008, Sugiyama.

* cited by examiner

REFLECTIVE MASK BLANK FOR EUV LITHOGRAPHY

TECHNICAL FIELD

The present invention relates to a reflective mask blank (in this specification, hereinafter referred to as "EUV mask blank") for EUV (Extreme Ultra Violet) lithography to be used for e.g. production of semiconductors.

BACKGROUND ART

In the semiconductor industry, a photolithography method using visible light or ultraviolet light has been employed as a technique for writing, on a Si substrate or the like, a fine pattern, which is required for forming an integrated circuit comprising such a fine pattern. However, the conventional photolithography method has been close to the resolution limit, while microsizing of semiconductor devices has been accelerated. In the case of the photolithography method, it is said that the resolution limit of a pattern is about ½ of an exposure wavelength, and that even if an immersion method is employed, the resolution limit is about ¼ of an exposure wavelength. Even if an immersion method using an ArF laser (193 nm) is employed, it is estimated that the resolution limit is about 45 nm. From this point of view, EUV lithography, which is an exposure technique using EUV light having a shorter wavelength than ArF lasers, is considered to be promising as an exposure technique for 45 nm or below. In this specification, "EUV light" means a ray having a wavelength in a soft X-ray region or a vacuum ultraviolet ray region, specifically a ray having a wavelength of from about 10 to 20 nm, in particular, of about 13.5 nm±0.3 nm.

EUV light is apt to be absorbed by any substances and the refractive indices of substances are close to 1 at this wavelength, whereby it is impossible to use a dioptric system like a conventional photolithography employing visible light or ultraviolet light. For this reason, for EUV light lithography, a catoptric system, i.e. a combination of a reflective photomask and a mirror, is employed.

A mask blank is a stacked member for fabrication of a photomask, which has not been patterned yet. In the case of an EUV mask blank, it has a structure wherein a substrate made of glass or the like has a reflective layer to reflect EUV light and an absorber layer to absorb EUV light, formed thereon in this order. As the reflective layer, a multilayer reflective film is usually used wherein high refractive index layers and low refractive index layers are alternately stacked to increase a light reflectance when irradiating the layer surface with EUV light. For the absorber layer, it is common to employ a material having a high absorption coefficient for EUV light, specifically e.g. a material containing Cr or Ta as the main component.

Patent Document 1 discloses that a nitride of a tantalum/boron alloy (TaBN), an oxide of a tantalum/boron alloy (TaBO) and an oxynitride of a tantalum/boron alloy (TaBNO) have high absorption coefficients for EUV light, and further have a low reflectance against deep-ultraviolet light within a wavelength region (from 190 nm to 260 nm) of light for inspection of a pattern, and thus, they are preferred as materials for an absorber layer.

Further, Patent Documents 1 and 2 disclose that in order to make the absorber layer surface to be a surface excellent in flatness and smoothness, the crystalline state of the absorber layer is preferably amorphous, and in order to make the crystalline state of a TaBN film, a TaBO film and a TaBNO film to be amorphous, the content of B in such films is preferably from 5 to 25 at. %.

Patent Document 1: JP-A-2004-6798
Patent Document 2: JP-A-2004-6799

DISCLOSURE OF THE INVENTION

Problems to be Solved by the Invention

However, in a case where the absorber layer is made of a TaBO film or a TaBNO film, if the content of O in the film increases, the insulating property of the absorber layer increases, and at the time of electron beam writing in such an absorber layer, charge-up takes place, such being undesirable.

On the other hand, in a case where the absorber layer is made of a TaBN film, there will be no substantial possibility that charge-up will occur at the time of electron beam writing.

In a case where the absorber layer is to be made of a TaBN film, film deposition is carried out in many cases by using a magnetron sputtering method as a method whereby defects are less likely to result. In such a case, for example, a Ta target and a B target may be used, and such targets may be discharged at the same time in a nitrogen atmosphere to form a TaBN film. Otherwise, a TaB compound target may be used, and such a compound target may be discharged in a nitrogen atmosphere to form a TaBN film.

However, for example, in the case of the method of using a Ta target and a B target, the B target has a high resistance and is a light element and thus its film deposition rate is at most 1/10 as compared with the Ta target in many cases. Therefore, in order to attain the content (at least 5 at. %) of B required to make the crystalline state of the film to be amorphous, as disclosed in Patent Document 1, the film deposition rate of the Ta target is required to be low, such being undesirable as the production efficiency decreases substantially.

On the other hand, in the method of using the TaB compound target, if a compound target comprising 20 at. % of B and 80 at. % of Ta, is, for example, used, the maximum content of B to be actually incorporated in the film will be at a level of 6 at. %, whereby it will be difficult to control the content of B in the film to be at least 5 at. %. Further, if N is added, the content of B in the film tends to be at most 4 at. %, whereby the crystalline state of the film cannot be made to be amorphous.

In order to solve this problem, it is conceivable to further increase the B content in the TaB compound target (for example, B is made to be 50 at. %, and Ta is made to be 50 at. %) to increase the content of B in the film.

However, as the content of B in the TaB target increases, the density of the target becomes low, whereby the processability becomes poor. Further, the electrical resistance of the TaB target increases, whereby the discharge tends to be unstable, and the film deposition rate tends to be slow. If the discharge becomes unstable, the composition or thickness of the film tends to be non-uniform, and in some cases, film deposition may become impossible.

It is an object of the present invention to solve the above-described problems of the prior art and to provide an EUV mask blank which is excellent in the characteristics as an EUV mask blank and which has an absorber layer which has a particularly low reflectance within a wavelength region of EUV light and light for inspection of a pattern and being easily controlled to have a desired film composition and film thickness.

Means to Solve the Problems

The present inventors have conducted an extensive study to solve the above problems and as a result, have found that when the absorber layer is made of a film (a TaHf film) comprising Ta and Hf, the crystalline state of the film becomes amorphous, and it is possible to obtain an absorber layer excellent in etching characteristics and optical characteristics. They have further found that when such a TaHf film is to be used as an absorber layer, it can be produced under a stabilized condition without bringing about deterioration of the film deposition rate.

The present invention has been made on the basis of such discoveries and provides a reflective mask blank for EUV lithography (hereinafter referred to as "the EUV mask blank of the present invention"), which comprises a substrate, and a reflective layer to reflect EUV light and an absorber layer to absorb EUV light, formed in this order on the substrate, wherein the absorber layer comprises tantalum (Ta) and hafnium (Hf), and in the absorber layer, the content of Hf is from 20 to 60 at. % and the content of Ta is from 40 to 80 at. %, and wherein the absorber layer has a content of N being 0 to at most 35 at. %.

In the EUV mask blank of the present invention, in the absorber layer, the compositional ratio of Ta and Hf is preferably Ta:Hf=7:3 to 4:6.

In the EUV mask blank of the present invention, the absorber layer preferably has a total content of B, Si and Ge being 0 to at most 5 at. %.

In the EUV mask blank of the present invention, the absorber layer preferably contains from 0.1 to 1.0 at. % of Zr.

In the EUV mask blank of the present invention, the crystalline state of the absorber layer is preferably amorphous.

Further, in the EUV mask blank of the present invention, the absorber layer preferably has a surface roughness (rms) of at most 0.5 nm at its surface.

Further, in the EUV mask blank of the present invention, the absorber layer preferably has a thickness of from 50 to 200 nm.

Further, the EUV mask blank of the present invention preferably has a protective layer between the reflective layer and the absorber layer, and the protective layer is made of Ru or a Ru compound.

In the EUV mask blank of the present invention, a low reflective layer against an inspection light to be used for inspection of a mask pattern is preferably formed on the absorber layer, the low reflective layer comprises tantalum (Ta), hafnium Hf) and oxygen (O), and in the low reflective layer, the total content of Ta and Hf is from 30 to 80 at. %, the compositional ratio of Ta to Hf is from 8:2 to 4:6, and the content of O is from 20 to 70 at. %.

In the low reflective layer, the compositional ratio of Ta to Hf is preferably Ta:Hf=7:3 to 4:6.

In the EUV mask blank of the present invention, a low reflective layer against an inspection light to be used for inspection of a mask pattern is preferably formed on the absorber layer, the low reflective layer comprises tantalum (Ta), hafnium Hf), oxygen (O) and nitrogen (N), and in the low reflective layer, the total content of Ta and Hf is from 30 to 80 at. %, the compositional ratio of Ta to Hf is Ta:Hf=8:2 to 4:6, the total content of N and O is from 20 to 70 at. %, and the compositional ratio of N to O is N:O=9:1 to 1:9.

In the low reflective layer, the compositional ratio of Ta to Hf is preferably Ta:Hf=7:3 to 4:6.

In a case where a low reflective layer is formed on the absorber layer, the low reflective layer preferably contains from 0.1 to 1.0 at. % of Zr.

Further, in a case where a low reflective layer is formed on the absorber layer, the low reflective layer preferably has a surface roughness (rms) of at most 0.5 nm at its surface.

Further, in a case where a low reflective layer is formed on the absorber layer, the low reflective layer preferably has a thickness of from 5 to 30 nm.

Further, in the EUV mask blank of the present invention, a protective layer to protect the reflective layer during formation of a pattern in the absorber layer, is preferably formed between the reflective layer and the absorber layer, and the contrast between light reflected on the surface of the protective layer and light reflected on the surface of the low reflective layer at a wavelength of light to be used for inspection of the pattern formed in the absorber layer, is at least 30%.

In a case where a protective layer is formed between the reflective layer and the absorber layer, the protective layer is preferably formed of any one selected from the group consisting of Ru, a Ru compound, $SiO_2$ and CrN.

In a case where a low reflective layer is formed on the absorber layer, the reflectance on the surface of the low reflective layer at a wavelength of light to be used for inspection of the pattern formed in the absorber layer, is preferably at most 15%.

In the EUV mask blank of the present invention, the absorber layer is preferably formed by carrying out a sputtering method using a target made of a TaHf compound.

Here, the target made of a TaHf compound preferably has a composition comprising Ta=30 to 70 at. % and Hf=70 to 30 at. %.

Further, the target made of a TaHf compound may contain from 0.1 to 5.0 at. % of Zr.

In a case where a low reflective layer comprising tantalum (Ta), hafnium (Hf) and oxygen (O) is formed on the absorber layer, the low reflective layer is preferably formed by carrying out a sputtering method using a target made of a TaHf compound in an atmosphere containing oxygen.

In a case where a low reflective layer comprising tantalum (Ta), hafnium (Hf), oxygen (O) and nitrogen (N) is formed on the absorber layer, the low reflective layer is preferably formed by carrying out a sputtering method using a target made of a TaHf compound in an atmosphere containing nitrogen and oxygen.

Here, the target made of a TaHf compound preferably has a composition comprising Ta=30 to 70 at. % and Hf=70 to 30 at. %.

Further, the target made of a TaHf compound may contain from 0.1 to 5.0 at. % of Zr.

EFFECTS OF THE INVENTION

In the EUV mask blank of the present invention, the absorber layer comprises Hf having a low electrical resistivity, and accordingly, it is free from deterioration of the film deposition rate during the film deposition for the absorber layer and free from instability of the discharge during the film deposition, which may occur in the case where the absorber layer has high electrical resistance and the absorber layer contains insulating B (boron). Accordingly, there will be no such problem that the film composition or the film thickness fluctuates at the time of forming the absorber layer or further that the film deposition becomes impossible.

In the EUV mask blank of the present invention, the crystalline state of the absorber layer is amorphous, and the absorber surface is excellent in smoothness. As a result, there will be no such a trouble that the edge roughness of a pattern formed in the absorber layer becomes large or that the dimensional precision of the pattern deteriorates.

Further, the absorber layer has characteristics excellent for an EUV mask blank, such that the reflectance against EUV light and the reflectance against light within a wavelength region of light to be used for inspection of a pattern, are low.

Further, the absorber layer comprising Ta and Hf has an etching rate higher than a TaBN film, whereby an effect to reduce the damage to the resist during etching, is expected.

Further, by such reduction of the damage to the resist, it is expected that the film thickness of the resist can be reduced.

Further, the content of nitrogen in the absorber layer is preferably 0 to at most 35 at. %, whereby the crystalline state of the absorber layer tends to readily be amorphous, the light reflectance in the wavelength region of light for inspection of a pattern can be made low, the etching rate can be made high, and an increase in electrical resistivity can be suppressed.

In the EUV mask blank of the present invention, by forming a low reflective layer on the absorber layer, it is possible to further suppress the reflectance against light in a wavelength region of light to be used for inspection of a pattern, and the contrast will be good at the time of inspection of a pattern which is carried out after forming a pattern on the mask blank. Further, since the crystalline structure of the low reflective layer is amorphous, the absorber surface is excellent in smoothness. As a result, the edge roughness of the pattern to be formed in the absorber layer will not increase, and the dimensional precision of the pattern will not deteriorate.

In the EUV mask blank of the present invention, when the absorber layer and the low reflective layer are to be formed by a sputtering method, by using a TaHf compound target having a specific composition, it is possible to avoid instability of the discharge or fluctuation in the film composition or film thickness.

MEANINGS OF SYMBOLS

1: EUV mask blank
11: Substrate
12: Reflective layer (multilayer reflective film)
13: Protective layer
14: Absorber layer
15: Low reflective layer

BEST MODE FOR CARRYING OUT THE INVENTION

Now, the EUV mask blank of the present invention will be described with reference to the drawings.

Figure 1:
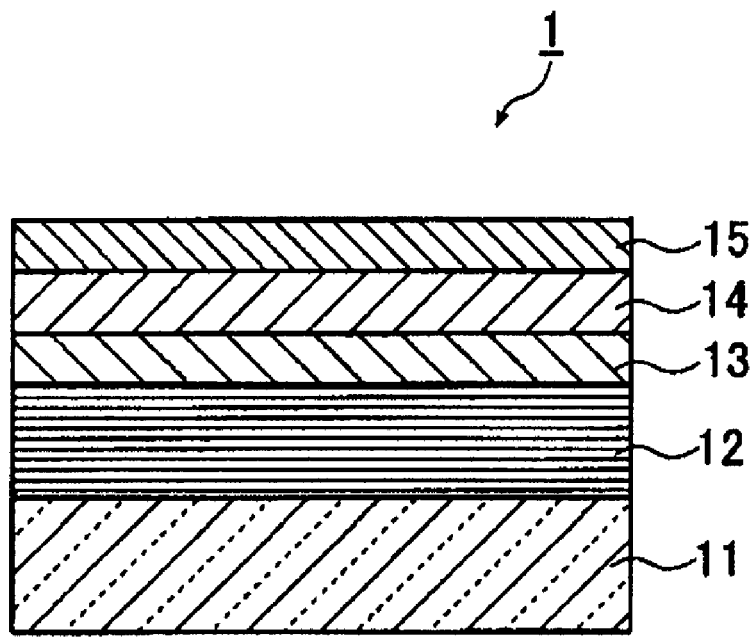
FIG. 1 is a schematic cross-sectional view illustrating one embodiment of the EUV mask blank of the present invention.

FIG. 1 is a schematic cross-sectional view illustrating one embodiment of the EUV mask blank of the present invention. In the mask blank 1 shown in FIG. 1, a reflective layer 12 to reflect EUV light and an absorber layer 14 to absorb EUV light are formed in this order on a substrate 11. Between the reflective layer 12 and the absorber layer 14, a protective layer 13 to protect the reflective layer 12 during formation of a pattern in the absorber layer 14, is formed. On the absorber layer 14, a low reflective layer 15 against an inspection light to be used for inspection of a mask pattern is formed. However, in the EUV mask blank 1 of the present invention, in the construction shown in FIG. 1, only the substrate 11, the reflective layer 12 and the absorber layer 14 are essential, and the protective layer 13 and the low reflective layer 15 are optional constituting elements. Further, the EUV mask blank of the present invention may have other layers formed in addition to the above layers.

Now, the individual constituting elements of the mask blank 1 will be described.

The substrate 11 is required to satisfy the characteristics as a substrate for an EUV mask blank. Therefore, the substrate 11 is preferably one which has a low thermal expansion coefficient (specifically the thermal expansion coefficient at 20° C. is preferably $0\pm0.05\times10^{-7}/°$ C., particularly preferably $0\pm0.03\times10^{-7}/°$ C.) and which is excellent in smoothness, flatness and resistance against a cleaning liquid to be used for e.g. cleaning of a mask blank or a photomask after formation of a pattern. Specifically, as such a substrate 11, glass having a low thermal expansion coefficient, such as a $SiO_2$—$TiO_2$ glass, may, for example, be used, but the substrate is not limited thereto, and a substrate of e.g. crystallized glass having β-quartz solid solution precipitated, quartz glass, silicon or metal, may also be used.

The substrate 11 preferably has a smooth surface with a surface roughness (rms) of at most 0.15 nm and a flatness of at most 100 nm, whereby a high reflectance and transfer precision can be obtained with a photomask after formation of a pattern.

The size, thickness, etc. of the substrate 11 are suitably determined depending upon the design values of the mask. In Examples shown hereinafter, a $SiO_2$—$TiO_2$ glass having a size of 6 inch (152 mm) square and a thickness of 0.25 inch (6.3 mm) was used.

It is preferred that no defects are present on the surface of the substrate 11 on the side on which the reflective layer 12 is to be formed. Even if they are present, in order that no phase defects will form by concave defects and/or convex defects, the depth of the concave defects and the height of the convex defects are preferably at most 2 nm, and the half value widths of such concave defects and convex defects are preferably at most 60 nm.

The reflective layer 12 is not particularly restricted so long as it is one having desired characteristics as a reflective layer for an EUV mask blank. Here, the characteristic particularly required for the reflective layer 12 is a high EUV light reflectance. Specifically, when the surface of the reflective layer 12 is irradiated at an incident angle of 6° with light in a wavelength region of EUV light, the maximum value of the light reflectance in the vicinity of a wavelength of 13.5 nm is preferably at least 60%, more preferably at least 65%. Even in a case where a protective layer 13 or a low reflection layer 15 is formed on the reflection layer 12, the maximum value of the light reflectance in the vicinity of a wavelength of 13.5 nm is preferably at least 60%, more preferably at least 65%.

As the reflective layer 12, a reflective multilayer film having high refractive index layers and low refractive index layers alternately stacked in a plurality of times, is usually used as the reflective layer 12, whereby a high EUV light reflectance can be attained. In the reflective multilayer film constituting the reflective layer 12, Mo is widely used for the high refractive index layers, and Si is widely used for the low refractive index layers. Namely, a reflective Mo/Si multilayer film is most common. However, the reflective multilayer film is not limited thereto, and a reflective Ru/Si multilayer film, a reflective Mo/Be multilayer film, a reflective Mo compound/Si compound multilayer film, a reflective Si/Mo/Ru multilayer film, a reflective Si/Mo/Ru/Mo multilayer film or a reflective Si/Ru/Mo/Ru multilayer film may also be used.

The thicknesses and the number of repeating layer units of the respective layers constituting the reflective multilayer film constituting the reflective layer 12 may suitably be selected depending upon the film materials to be used and the EUV light reflectance required for the reflective layer. When a reflective Mo/Si multilayer film is taken as an example, in order to form a reflective layer 12 having the maximum value of the EUV light reflectance being at least 60%, the reflective multilayer film may be formed by stacking Mo layers having a thickness of 2.3±0.1 nm and Si layers having a thickness of 4.5±0.1 nm so that the number of repeating units will be from 30 to 60.

Suitable reflective layers may be prepared by conventional methods known to those of ordinary skill in the art without undue experimentation.

Here, the respective layers constituting the reflective multilayer film as the reflective layer 12 may be formed to have the desired thickness by means of a well-known film deposition method such as magnetron sputtering or ion beam sputtering. For example, in a case where a reflective Si/Mo multilayer film is formed by means of ion beam sputtering, it is preferred that a Si film is deposited to have a thickness of 4.5 nm at an ion-accelerated voltage of from 300 to 1,500 V at a film deposition rate of from 0.03 to 0.30 nm/sec by using a Si target as the target and using an Ar gas (gas pressure: $1.3 \times 10^{-2}$ Pa to $2.7 \times 10^{-2}$ Pa) as the sputtering gas, and then a Mo film is deposited to have a thickness of 2.3 nm at an ion-accelerated voltage of from 300 to 1,500 V at a film deposition rate of from 0.03 to 0.30 nm/sec by using a Mo target as the target and using an Ar gas (gas pressure: $1.3 \times 10^{-2}$ Pa to $2.7 \times 10^{-2}$ Pa) as the sputtering gas. This operation is regarded as one cycle, and by stacking Si films and Mo films for 40 to 50 cycles, a reflective Si/Mo multilayer film will be formed.

In order to prevent oxidation of the surface of the reflective layer 12, the uppermost layer of the reflective multilayer film constituting the reflective layer 12 is preferably a layer made of a hardly oxidizable material. The layer made of a hardly oxidizable material will function as a cap layer of the reflective layer 12. As a specific example of the layer made of a hardly oxidizable material functioning as cap layer, a Si layer may, for example, be mentioned. In a case where the reflective multilayer film constituting the reflective layer 12 is a Si/Mo film, the uppermost layer may be made to be a Si layer, so that the uppermost layer will function as a cap layer. In such a case, the thickness of the cap layer is preferably 11±2 nm.

The protective layer 13 is provided for the purpose of protecting the reflective layer 12, so that the reflective layer 12 will not receive a damage by an etching process at the time of forming a pattern in the absorber layer 14 by an etching process, usually by a dry etching process. Accordingly, as the material for the protective layer 13, a material is selected which is hardly susceptible to an influence by the etching process of the absorber layer 14, i.e. a material having an etching rate slower than the absorber layer 14 and yet is hardly susceptible to a damage by such an etching process. A material which satisfies such conditions, may, for example, be Cr, Al, Ta or their nitrides, Ru or a Ru compound (such as RuB or RuSi), or $SiO_2$, $Si_3N_4$, $Al_2O_3$ or a mixture thereof. Among them, Ru or a Ru compound (such as RuB or RuSi), CrN or $SiO_2$ is preferred, and Ru or a Ru compound (such as RuB or RuSi) is particularly preferred.

The thickness of the protective layer 13 is preferably from 1 to 60 nm.

The protective layer 13 is formed by using a well-known film deposition method such as magnetron sputtering or ion beam sputtering. In a case where a Ru film is formed by magnetron sputtering, it is preferred to carry out film deposition at an applied electric power of from 30 W to 500 W at a film deposition rate of from 5 to 50 nm/min so that the thickness will be from 2 to 5 nm by using a Ru target as the target and using an Ar gas (gas pressure: $1.0 \times 10^{-1}$ Pa to $10 \times 10^{-1}$ Pa) as the sputtering gas.

The characteristic particularly required for the absorber layer 14 is that the EUV light reflectance is very low. Specifically, when the surface of the absorber layer 14 is irradiated with light in a wavelength region of EUV light, the maximum light reflectance in the vicinity of a wavelength of 13.5 nm is preferably at most 0.5%, more preferably at most 0.1%.

In order to attain the above characteristic, the absorber layer is preferably made of a material having a high absorption coefficient of EUV light.

The absorber layer 14 of the EUV mask blank 1 of the present invention comprises tantalum (Ta) and hafnium (Hf) in a specific ratio which will be described hereinafter, whereby the above characteristic is attained.

The content of Hf in the absorber layer 14 is from 20 to 60 at. %. If the content of Hf in the absorber layer 14 is less than 20 at. %, the crystalline state of the absorber layer 14 tends to hardly become amorphous. If the content of Hf in the absorber layer 14 exceeds 60 at %, the etching characteristics of the absorber layer tends to deteriorate, and it becomes difficult to satisfy the required etching selective ratio.

In the EUV mask blank of the present invention, the Hf content in the absorber layer 14 is within the above range, whereby the crystalline state of the absorber layer tends to be readily amorphous and the absorber surface will be excellent in smoothness. Further, the absorber layer 14 has excellent characteristics for an EUV mask blank, such that the EUV light reflectance and the light reflectance in the wavelength region of light for inspection of a pattern, are low.

The content of Hf in the absorber layer 14 is more preferably from 30 to 50 at. %, further preferably from 30 to 45 at %.

Patent Document 1 mentions Hf as an example of a metal element contained in an upper layer and a lower layer in an double-layered absorber comprising, as the lower layer, an absorber layer constituted by an absorber for an exposure light in a short wavelength region including extreme ultraviolet wavelength and, as the upper layer, a low reflective layer constituted by an absorber for an inspection light to be used for inspection of a mask pattern. However, the structure comprising Ta and Hf is not disclosed at all. Further, Patent Document 1 discloses that when the absorber layer is made to be a TaBN film, a TaBO film or a TaBNO film, the crystalline state becomes amorphous, but there is no disclosure that when Hf is incorporated, the crystalline state becomes amorphous.

Further, it is widely known that a metal crystal can be made to be amorphous by mixing an element such as B or Si, and in Patent Document 1, such a technique is used to make the absorber layer to be amorphous thereby to make the surface smooth. However, it is not known that a film comprising two metal elements of Ta and Hf at the same time, can be made to be amorphous, and also in Patent Document 1, Ta and Hf are mentioned merely as examples of many metal elements which may be contained in the absorber layer.

According to the present invention, the crystalline state of the absorber layer can be made to be amorphous without using an element known to contribute to conversion of a conventional metal crystal to be amorphous, such as B or Si. Further, in addition to B and Si, Ge may be mentioned as an element known to contribute to conversion of conventional metal crystal to be amorphous. Such an element is one which contributes to conversion of a metal crystal to be amorphous, but when incorporated to the absorber layer, an unavoidable problem will also result. For example, when B is incorporated, the electrical resistance of the target to be used for the film deposition tends to be large, whereby the discharge tends to be unstable, and at the same time, the film deposition rate tends to be low. If the discharge becomes unstable, there will be a problem such that the composition or thickness of the film tends to be non-uniform, and in some cases, there will be a problem such that the film deposition will be impossible. Further, if Si is incorporated, the EUV absorption coefficient of Si is small, and there will be a problem such that the EUV light absorption characteristic of the absorber layer tends to be low.

Therefore, it is preferred that the absorber layer 14 does not substantially contain such elements, and the total content of such elements is preferably 0 to at most 5 at. %. The total content of such elements is more preferably 0 to at most 4 at. %, further preferably 0 to at most 3 at. %.

In the absorber layer 14, the rest excluding Hf is preferably Ta. Accordingly, the content of Ta in the absorber layer 14 is preferably from 40 to 80 at. %. The content of Ta in the absorber layer 14 is more preferably from 50 to 70 at %, further preferably from 55 to 70 at %.

Further, the absorber layer 14 may contain an element other than Ta and Hf, as the case requires. In such a case, the element to be incorporated to the absorber layer 14 is required to satisfy suitability for a mask blank, such as the absorption characteristic for EUV light.

However, it is preferred that the absorber layer 14 does not substantially contain nitrogen (N). Specifically, the content of nitrogen in the absorber layer 14 is preferably 0 to at most 35 at. % in that the crystalline state of the absorber layer 14 tends to readily be amorphous, the light reflectance in the wavelength region of light for inspection of a pattern can be made low, the etching rate can be made high and an increase in electrical resistivity can be suppressed. The content of nitrogen in the absorber layer 14 is more preferably 0 to at most 10 at. %, further preferably 0 to at most 1 at. %, still more preferably 0 to at most 0.5 at. %, particularly preferably 0 to at most 0.05 at. %.

The total content of Ta and Hf is more preferably from 45 to 80 at. %, further preferably from 45 to 75 at %. Further, the compositional ratio of Ta to Hf is more preferably from 7:3 to 4:6, further preferably from 6.5:3.5 to 4.5:5.5, particularly preferably from 6:4 to 5:5. Here, in the present invention, the compositional ratio of Ta to Hf means a compositional ratio of Ta to Hf by atomic ratio.

The absorber layer 14 may contain from 0.1 to 1.0 at. % of Zr from the target used during the film deposition. Zr has a low coefficient for absorption of EUV light, and if the content of Zr is larger than necessary, the performance as an absorber layer is likely to deteriorate, such being undesirable.

When the absorber layer 14 has the above-described construction, its crystalline state is preferably amorphous. In this specification, "the crystalline state is amorphous" includes one having a fine crystalline structure in addition to one having an amorphous structure with no crystalline structure at all. When the absorber layer 14 is a film of an amorphous structure or a film of a fine crystalline structure, the surface of the absorber layer 14 is excellent in smoothness.

In the EUV mask blank 1 of the present invention, it is preferred that the absorber layer 14 is a film of an amorphous structure or a film of a fine crystalline structure, whereby the surface roughness (rms) of the absorber layer 14 is at most 0.5 nm. Here, the surface roughness of the absorber layer 14 may be measured by means of an atomic force microscope. If the surface roughness of the absorber layer 14 is large, the edge roughness of a pattern formed in the absorber layer 14 tends to be large, whereby the dimensional precision of the pattern tends to deteriorate. As the pattern becomes fine, the influence of the edge roughness becomes distinct, and therefore, the surface of the absorber layer 14 is required to be smooth.

When the surface roughness (rms) of the absorber layer 14 is at most 0.5 nm, the surface for the absorber layer 14 is sufficiently smooth, whereby there will be no possibility of deterioration of the dimensional precision of a pattern due to an influence of the edge roughness. The surface roughness (rms) of the absorber layer 14 is more preferably at most 0.4 nm, further preferably at most 0.3 nm.

Further, the crystalline state of the absorber layer 14 being amorphous, i.e. being of an amorphous structure or a fine crystalline structure, can be ascertained by an X-ray diffraction (XRD) method. When the crystalline state of the absorber layer 14 is of an amorphous structure or a fine crystalline structure, no sharp peak is observed among the diffraction peaks obtainable by the XRD measurement.

When the absorber layer 14 has the above-described construction, in a usual chlorine etching, the etching rate will be high, and the etching selective ratio to the protective layer will be at least 10. In this specification, the etching selective ratio is calculated by using the following formula:

Etching selective ratio=Etching rate of absorber layer 14/Etching rate of protective layer 13

The etching selective ratio is preferably at least 10, more preferably at least 11, further preferably at least 12.

When the absorber layer 14 has the above-described construction, the electric resistivity will be low, and there will be no problem of charge up during the electron beam writing. The electric resistivity of the absorber layer 14 is preferably at most 0.1 Ω·cm, more preferably at most 0.01 Ω·cm, further preferably at most 0.001 Ω·cm.

The thickness of the absorber layer 14 is preferably from 50 to 200 nm.

The absorber layer 14 of the above construction can be formed by carrying out a sputtering method using a TaHf compound target, for example, magnetron sputtering or ion beam sputtering.

Here, it is preferred to form the absorber layer 14 by discharging a TaHf compound target in an environment where a gas containing nitrogen atoms (such as $N_2$ or NO) is not substantially present, specifically in an environment where the total partial pressure of a gas containing nitrogen atoms is at most $1 \times 10^{-4}$ Pa, for example, in an inert gas atmosphere such as in an argon (Ar) atmosphere.

The TaHf compound target preferably has a composition comprising Ta=30 to 70 at. % and Hf=70 to 30 at. %, whereby an absorber layer having a desired composition can be obtained, and it is thereby possible to avoid fluctuation in the film composition or film thickness. The TaHf compound target may contain from 0.1 to 5.0 at. % of Zr.

Here, a TaHf compound target containing Hf having a low electrical resistivity is used, whereby, as is different from a case where a TaB compound target containing B having a high electrical resistivity and high insulating property, is used, the film deposition is very stable, and it is possible to control the film composition or film thickness easily.

To form the absorber layer 14 by the above-mentioned method, specifically, the method may be carried out under the following film deposition conditions.

Sputtering gas: Ar gas (gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Degree of vacuum before film deposition: At most $1 \times 10^{-4}$ Pa, preferably at most $1 \times 10^{-5}$ Pa, more preferably at most $10^{-6}$ Pa.

Applied electrical power: 30 to 1,000 W, preferably 50 to 750 W, more preferably 80 to 500 W Film deposition rate: 2.0 to 60 nm/min, preferably 3.5 to 45 nm/min, more preferably 5 to 30 nm/min The low reflective layer 15 is constituted by a film which shows a low reflectance against an inspection light to be used for inspection of a mask pattern. In the preparation of a EUV mask, after forming a pattern in the absorber layer, inspection is carried out to ascertain whether the pattern is formed as designed. In such an inspection of a mask pattern, an inspection machine is usually used wherein light of about 257 nm is used as an inspection light. Namely, inspection is carried out by the difference in the reflectance against such light of about 257 nm, specifically by the difference in the reflectance between the surface exposed by removal of the absorber layer 14 by formation of a pattern and the surface of the absorber layer 14 remained without being removed by the formation of the pattern. Here, the former is the surface of the reflective layer 12 or the surface of the protective layer 13, usually the surface of the protective layer 13. Accordingly, if the difference in the reflectance between the surface of the protective layer 13 and the surface of the absorber layer 14 against the wavelength of the inspection light is small, the contrast at the time of the inspection becomes poor, and no accurate inspection can be done.

The absorber layer 14 having the above-described construction has an extremely low EUV light reflectance and thus has an excellent characteristic as an absorber layer for an EUV mask blank 1, but when inspected with the wavelength of the inspection light, the light reflectance may not necessarily be said to be sufficiently low. As a result, the difference between the reflectance on the surface of the absorber layer 14 and the reflectance on the surface of the protective layer 13 at the wavelength of the inspection light may be small, and the contrast at the time of inspection may not be sufficiently obtained. If the contrast at the time of the inspection is not sufficiently obtained, defects in the pattern cannot sufficiently be identified in the mask inspection, and no accurate inspection of defects can be carried out.

In the EUV mask blank 1 of the present invention, by forming a low reflective layer 15 against the inspection light is formed on the absorber layer 14, the contrast at the time of the inspection will be good. In other words, the light reflectance at the wavelength of the inspection light will be very low. Specifically, when the surface of the low reflective layer 15 is irradiated with light in a wavelength region of the inspection light, the maximum light reflectance at the wavelength of the inspection light is preferably at most 15%, more preferably at most 10%, further preferably at most 5%.

When the light reflectance at the wavelength of the inspection light on the surface of the low reflective layer 15 is at most 15%, the contrast at the time of the inspection is good. Specifically, the contrast between reflected light with the wavelength of the inspection light on the surface of the protective layer 13 and reflected light with the wavelength of the inspection light on the surface of the low reflective layer 15, is at least 30%.

In this specification, the contrast can be obtained by using the following formula (1).

$$\text{Contrast}(\%) = ((R_2 - R_1)/(R_2 + R_1)) \times 100 \quad \text{formula (1)}$$

Here, at the wavelength of the inspection light, $R_2$ is the reflectance on the surface of the protective layer 13, and $R_1$ is the reflectance on the surface of the low reflective layer 15.

Figure 2:
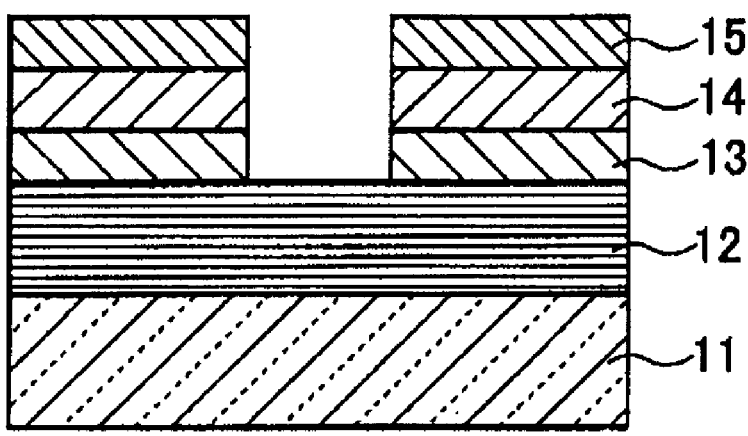
FIG. 2 illustrates a state wherein a pattern was formed in an absorber layer 14 (and a low reflective layer 15) of the EUV mask blank 1 shown in FIG. 1.

The above $R_1$ and $R_2$ are measured in a state where, as shown in FIG. 2, a pattern is formed in the absorber layer 14 (and the low reflective layer 15) of an EUV mask blank 1 shown in FIG. 1. The above $R_2$ is a value measured at the surface of the reflective layer 12 or the surface of the protective layer 13 exposed by removal of the absorber layer 14 and the low reflective layer 15 by the formation of the pattern, and $R_1$ is a value measured at the surface of the low reflective layer 15 remained without being removed by the formation of the pattern, in FIG. 2.

In the present invention, the contrast represented by the above formula (1) is more preferably at least 45%, further preferably at least 60%, particularly preferably at least 80%.

In order to attain the above-described characteristic, the low reflective layer 15 is preferably made of a material having a refractive index at the wavelength of the inspection light being lower than the absorber layer 14, and its crystalline state is preferably amorphous.

With the low reflective layer 15 of the EUV mask blank 1 of the present invention, the above-described characteristic is attained by comprising Ta, Hf and oxygen (O) in a specific ratio which will be described below.

In the low reflective layer 15, it is preferred that the total content of Ta and Hf is from 30 to 80 at. %, and the compositional ratio of Ta to Hf is from 8:2 to 4:6. If the total content of Ta and Hf is less than 30 at. %, the electrical conductivity of the low reflective layer 15 tends to be low, and a problem of charge-up is likely to result at the time of electron beam writing in the low reflective layer 15. If the total content of Ta and Hf exceeds 80 at. %, it tends to be difficult to sufficiently lower the light reflectance against light for inspection of a pattern. Further, if Hf is lower than the above compositional ratio, the crystalline state of the low reflective layer 15 tends to be hardly amorphous. If Hf in the low reflective layer 15 is higher than the above compositional ratio, the etching characteristic of the low reflective layer tends to deteriorate, and the required etching selective ratio may not be satisfied.

In the low reflective layer 15, the content of O is preferably from 20 to 70 at. %. If the content of O is lower than 20 at. %, it may be impossible to sufficiently lower the light reflectance in the wavelength region of the light for inspection of a pattern. If the content of O is higher than 70 at. %, the acid resistance of the low reflective layer 15 tends to be low, and the insulating property of the low reflective layer 15 tends to increase, whereby a problem may be likely such that charge-up takes place at the time of electron beam writing in the low reflective layer 15.

The total content of Ta and Hf is more preferably from 35 to 80 at. %, further preferably from 35 to 75 at. %. Further, the compositional ratio of Ta to Hf is more preferably Ta:Hf=7:3 to 4:6, further preferably 6.5:3.5 to 4.5:5.5, particularly preferably 6:4 to 5:5. the content of O is more preferably from 20 to 65 at. %, further preferably from 25 to 65 at. %.

Further, the low reflective layer 15 may contain an element other than Ta, Hf and O, as the case requires. In such a case, the element to be incorporated to the low reflective layer 15 is required to satisfy suitability as a mask blank, such as an absorption characteristic for EUV light.

Nitrogen (N) may be mentioned as an example of the element which may be incorporated to the low reflective layer 15. By the incorporation of N to the low reflective layer 15, smoothness of the surface of the low reflective layer 15 is expected to improve.

In a case where the low reflective layer 15 contains N, it is preferred that a total content of Ta and Hf in the low reflective layer 15 is from 30 to 80 at. %, and the compositional ratio of Ta to Hf is Ta:Hf=8:2 to 4:6, the total content of N and O is from 20 to 70 at. %, and the compositional ratio of N to O is from 9:1 to 1:9. Further, in the present invention, the compositional ratio of N to O means a compositional ratio of N to O by atomic ratio. If the total content of Ta and Hf is less than 30 at. %, the electrical conductivity of the low reflective layer 15 tends to decrease and a charge-up problem may be likely at the time of electron beam writing in the low reflective layer 15. If the total content of Ta and Hf exceeds 80 at. %, it will be impossible to sufficiently lower the light reflectance against light for inspection of a pattern. If Hf in the low reflective layer 15 is lower than the above compositional ratio, the crystalline state of the low reflective layer 15 may not be amorphous. If Hf in the low reflective layer 15 is higher than the above compositional ratio, the etching characteristic of the low reflective layer tends to deteriorate, and the required etching selective ratio may not be satisfied. Further, in a case where the content of N and O is lower than 20 at. %, the light reflectance in a wavelength region of light for inspection of a pattern may not be made sufficiently low. In a case where the content of N and O is higher than 70 at. %, the acid resistance of the low reflective layer 15 tends to be low, and the insulating property of the low reflective layer 15 tends to increase, whereby a problem may be likely such that charge-up takes place at the time of electron beam writing in the low reflective layer 15.

The total content of Ta and Hf is more preferably from 35 to 80 at. %, further preferably from 35 to 75 at. %. Further, the compositional ratio of Ta to Hf is more preferably Ta:Hf=7:3 to 4:6, further preferably 6.5:3.5 to 4.5:5.5, particularly preferably 6:4 to 5:5. The total content of N and O is more preferably from 20 to 65 at. %, further preferably from 25 to 65 at. %.

When the low reflective layer 15 is of the above-described construction, its crystalline state is amorphous, and its surface is excellent in smoothness. Specifically, the surface roughness (rms) of the low reflective layer 15 is preferably at most 0.5 nm.

As mentioned above, in order to prevent deterioration of the dimensional precision of a pattern due to an influence of edge roughness, the surface of the absorber layer 14 is required to be smooth. The low reflective layer 15 is formed on the absorber layer 14, and for the same reason, its surface is required to be smooth.

When the surface roughness (rms) of the surface of the low reflective layer 15 is at most 0.5 nm, the surface of the low reflective layer 15 is sufficiently smooth, whereby there will be no possibility that the dimensional precision of a pattern will deteriorate due to an influence of edge roughness. The surface roughness (rms) of the low reflective layer 15 is more preferably at most 0.4 nm, further preferably at most 0.3 nm.

Further, the crystalline state of the low reflective layer 15 being amorphous, i.e. being an amorphous structure or a fine crystalline structure, may be ascertained by an X-ray diffraction (XRD) method. When the crystalline state of the low reflective layer 15 is of an amorphous structure or a fine crystalline structure, no sharp peak will be observed among the diffraction peaks obtainable by the XRD measurement.

In a case where the low reflective layer 15 is formed on the absorber layer 14, the total thickness of the absorber layer 14 and the low reflective layer 15 is preferably from 55 to 130 nm. Further, if the thickness of the low reflective layer 15 is larger than the thickness of the absorber layer 14, the EUV light absorbing characteristic at the absorber layer 14 is likely to deteriorate. Accordingly, the thickness of the low reflective layer 15 is preferably less than the thickness of the absorber layer. Therefore, the thickness of the low reflective layer 15 is preferably from 5 to 30 nm, more preferably from 10 to 20 nm.

The low reflective layer 15 of the above-described construction can be formed by carrying out a sputtering method using a TaHf compound target, for example, magnetron sputtering or ion beam sputtering.

Further, in a case where the low reflective layer 15 contains no N, i.e. comprises Ta, Hf and O, the low reflective layer 15 is formed by discharging a TaHf compound target in an oxygen ($O_2$) atmosphere diluted by an inert gas such as argon. Otherwise, a TaHf compound target may be discharged in an inert gas atmosphere to form a film comprising Ta and Hf, and then the formed film may be oxidized by e.g. exposing it to oxygen plasma or irradiating it with ion beams using oxygen, to obtain a low reflective layer 15 comprising Ta, Hf and O.

On the other hand, in a case where the low reflective layer 15 contains N, i.e. comprises Ta, Hf, O and N, the low reflective layer 15 is formed by discharging a TaHf compound target in an oxygen ($O_2$)/nitrogen ($N_2$) mixed gas atmosphere diluted with argon. Otherwise, a TaHf compound target may be discharged in a nitrogen ($N_2$) atmosphere diluted with argon to form a film comprising Ta, Hf and N, and then the formed film is oxidized by exposing it to oxygen plasma or irradiating it with ion beams using oxygen, to obtain a low reflective layer 15 comprising Ta, Hf, O and N.

The TaHf compound target preferably has a composition comprising Ta=30 to 70 at. % and Hf=70 to 30 at. %, whereby a low reflective layer having a desired composition can be obtained, and it is possible to avoid fluctuation of the film composition or film thickness. The TaHf compound target may contain from 0.1 to 5.0 at. % of Zr.

In order to form a low reflective layer 15 on the absorber layer 14 by the above-described method, specifically, the method can be carried out under the following film deposition conditions.

Case wherein Low Reflective Layer (Containing No N) is Formed

Sputtering gas: Mixed gas of Ar and $O_2$ ($O_2$ gas concentration: 3 to 80 vol %, preferably 5 to 60 vol %, more preferably 10 to 40 vol %. Gas pressure: $1.0 \times 10^{-1}$ Pa to $50 \times 10^{-1}$ Pa, preferably $1.0 \times 10^{-1}$ Pa to $40 \times 10^{-1}$ Pa, more preferably $1.0 \times 10^{-1}$ Pa to $30 \times 10^{-1}$ Pa)

Applied electric power: 30 to 1,000 W, preferably 50 to 750 W, more preferably 80 to 500 W Film deposition rate: 2.0 to 60 nm/min, preferably 3.5 to 45 nm/min, more preferably 5 to 30 nm/min Case wherein Low Reflective Layer (Containing N) is Formed Sputtering gas: Mixed gas of Ar, $O_2$ and $N_2$ ($O_2$ gas concentration: 5 to 40 vol %, $N_2$ gas concentration: 5 to 40 vol %, preferably $O_2$ gas concentration: 6 to 35 vol %, $N_2$ gas concentration: 6 to 35 vol %, more preferably $O_2$ gas concentration: 10 to 30 vol %, $N_2$ gas concentration: 10 to 30 vol %. Gas pressure: $1.0 \times 10^{-1}$ Pa to $50 \times 10^{-}$Pa, preferably $1.0 \times 10^{-1}$ Pa to $40 \times 10^{-1}$ Pa, more preferably $1.0 \times 10^{-1}$ Pa to $30 \times 10^{-1}$ Pa)

Applied electric power: 30 to 1,000 W, preferably 50 to 750 W, more preferably 80 to 500 W Film deposition rate: 2.0 to 60 nm/min, preferably 3.5 to 45 nm/min, more preferably 5 to 30 nm/min Further, in the EUV mask blank 1 of the present invention, it is preferred to form the low reflective layer 15 on the absorber layer 14, because the wavelength of light for inspection of a pattern is different from the wavelength of EUV light. Accordingly, in a case where EUV light (in the vicinity of 13.5 nm) is used as light for inspection of a pattern, it is considered unnecessary to form a low reflective layer 15 on the absorber layer 14. The wavelength of the inspection light tends to shift to the short wavelength side as the pattern dimension becomes small and in future, it may shift to 193 nm or further shift to 13.5 nm. When the wavelength of the inspection light is 13.5 nm, it is considered unnecessary to form a low reflective layer 15 on the absorber layer 14.

The EUV mask blank 1 of the present invention may have a functional film known in the field of EUV mask blanks, in addition to the reflective layer 12, the protective layer 13, the absorber layer 14 and the low reflective layer 15. As a specific example of such a functional film, a high dielectric coating may be mentioned which is applied on the rear side of a substrate in order to accelerate electrostatic chucking of the substrate, as disclosed in e.g. JP-A-2003-501823. Here, in the substrate 11 in FIG. 1, the rear side of the substrate means the surface on the side opposite to the side on which the reflective layer 12 is formed. For the high dielectric coating to be provided on the rear side of the substrate for such a purpose, the electrical conductivity and the thickness of the constituting material are selected so that the sheet resistance will be at most $100\Omega/\square$. The constituting material for the high dielectric coating may be selected widely from those disclosed in known literatures. For example, a high dielectric coating disclosed in JP-A-2003-501823, specifically, a coating comprising silicon, TiN, molybdenum, chromium and TaSi, may be applied. The thickness of the high dielectric coating may, for example, be from 10 to 1,000 nm.

The high dielectric coating may be formed by using a known film deposition method, for example, a sputtering method such as magnetron sputtering or ion beam sputtering, a CVD method, a vacuum deposition method or an electrolytic plating method.

EXAMPLES

Now, the present invention will be described in further detail with reference to Examples and Comparative Examples.

Example 1

In this Example, an EUV mask blank 1 shown in FIG. 1 was prepared. However, in the EUV mask blank 1 in Example 1, a low reflective layer 15 was not formed on an absorber layer 14. As a substrate 11 for film deposition, a $SiO_2$—$TiO_2$ glass substrate (size: 6 inch (152 mm) square, thickness: 6.3 mm) was used. This glass substrate has a thermal expansion coefficient of $0.2 \times 10^{-7}$/° C., a Young's modulus of 67 GPa, a Poisson ratio of 0.17 and a specific rigidity of $3.07 \times 10^7$ $m^2/s^2$. This glass substrate was formed by polishing to have a smooth surface with a surface roughness (rms) of at most 0.15 nm and to a flatness of at most 100 nm.

On the rear side of the substrate 11, a Cr film having a thickness of 100 nm was deposited by means of magnetron sputtering to provide a high dielectric coating having a sheet resistance of $100\Omega/\square$.

To a flat plate-shaped usual electrostatic chuck, the substrate 11 (size: 6 inch (152 mm) square, thickness: 6.3 mm) was fixed by means of the formed Cr film, and on the surface of the substrate 11, a Si film and a Mo film were alternately deposited by ion beam sputtering for 40 cycles, to form a reflective Si/Mo multilayer film (reflective layer 12) having a total film thickness of 272 nm ((4.5 nm+2.3 nm)×40).

Further, on the reflective Si/Mo multilayer film (reflective layer 12), a Ru film (film thickness: 2.5 nm) was deposited by ion beam sputtering to form a protective layer 13.

The film deposition conditions for the Si film, the Mo film and the Ru film were as follows.

Film Deposition Conditions for Si Film
  Target: Si target (boron-doped)
  Sputtering gas: Ar gas (gas pressure: 0.02 Pa)
  Voltage: 700 V
  Film deposition rate: 0.077 nm/sec
  Film thickness: 4.5 nm Film Deposition Conditions for Mo Film
  Target: Mo target
  Sputtering gas: Ar gas (gas pressure: 0.02 Pa)
  Voltage: 700 V
  Film deposition rate: 0.064 nm/sec
  Film thickness: 2.3 nm Film Deposition Conditions for Ru Film
  Target: Ru target
  Sputtering gas: Ar gas (gas pressure: 0.02 Pa)
  Voltage: 700 V
  Film deposition rate: 0.023 nm/sec
  Film thickness: 2.5 nm Then, on the protective layer 13, an absorber layer 14 (TaHf film) containing Ta and Hf was formed by magnetron sputtering to obtain an EUV mask blank 1 having the reflective layer 12, the protective layer 13 and the absorber layer 14 formed in this order on the substrate 11.

The film deposition conditions for the absorber layer 14 were as follows.

Film Deposition Conditions for Absorber Layer 14 (TaHf Film)
  Target: TaHf compound target (compositional ratio: Ta 55 at. %, Hf 45 at. %)
  Sputtering gas: Ar gas (gas pressure: 0.3 Pa)
  Applied electric power: 150 W
  Film deposition rate: 0.29 nm/sec
  Film thickness: 60 nm
  Degree of vacuum before film deposition: $4 \times 10^{-6}$ Pa The following evaluations (1) to (4) were carried out with respect to the absorber layer of the EUV mask blank obtained by the above procedure.

(1) Film Composition

The composition of the absorber layer 14 (TaHf film) was measured by using an X-ray photoelectron spectrometer (Number 5500, manufactured by PERKIN ELEMER-PHI). The compositional ratio (at. %) of the absorber layer 14 (TaHf film) was Ta:Hf=55:45 (content of Ta: 55 at. %, content of Hf: 45 at. %). The content of N in the absorber layer was at most 0.05 at. %. The content of Zr in the absorber layer was from 0.3 to 0.7 at. %.

(2) Crystalline State

The crystalline state of the absorber layer 14 (TaHf film) was ascertained by an X-ray diffractometer (manufactured by Rigaku Corporation). No sharp peak was observed among the obtained diffraction peaks, whereby it was confirmed that the crystalline state of the absorber layer 14 (TaHf film) was of an amorphous structure or a fine crystalline structure.

(3) Surface Roughness

The surface roughness of the absorber layer 14 (TaHf film) was measured by a dynamic force mode by using an atomic force microscope (SPI-3800, manufactured by SII). The measuring region for the surface roughness was 1 μm×1 μm, and as the cantilever, SI-DF40 (manufactured by SII) was used. The surface roughness (rms) of the absorber layer was 0.10 nm.

(4) Resistance Value

The resistance value of the absorber layer 14 (TaHf film) was measured by using a four-point probe meter (Loresta APMCP-T400, manufactured by Mitsubishi Yuka K.K.) and was found to be $1.8 \times 10^{-4}$ Ω·cm.

Example 2

In this Example, an EUV mask blank 1 was prepared wherein a low reflective layer 15 (TaHfON film) containing Ta, Hf, O and N is formed on an absorber layer 14.

In this Example, the procedure to form an absorber layer 14 on a protective layer 13 was carried out in the same manner as in Example 1. On the absorber layer 14, a low reflective layer (TaHfON film) containing Ta, Hf, O and N was formed by magnetron sputtering, as a low reflective layer 15 against an inspection light having a wavelength of 257 nm. The compositional ratio (at. %) of the low reflective layer was measured by the same method as in Example 1 and found to be Ta:Hf:N:O=35:15:15:35.

The film deposition conditions for the low reflective layer 15 (TaHfON film) were as follows.

Film Deposition Conditions for Low Reflective Layer 15 (TaHfOn Film)

Target: TaHf compound target (compositional ratio: Ta 55 at. %, Hf 45 at. %)
Sputtering gas: Mixed gas of Ar, $N_2$ and $O_2$ (Ar: 45 vol %, $N_2$: 23 vol %, $O_2$: 32 vol %, gas pressure: 0.3 Pa)
Applied electric power: 150 W
Film deposition rate: 0.13 nm/sec
Film thickness: 10 nm The following evaluation (5) was carried out with respect to the low reflective layer 15 (TaHfON film) of the EUV mask blank obtained by the above procedure.

(5) Reflection Characteristic (Evaluation of Contrast)

In Example 1, at a stage where up to the protective layer 13 (Ru film) was formed, the reflectance on the surface of the protective layer 13 against the light (wavelength: 257 nm) for inspection of a pattern was measured by using a spectrophotometer. Further, in Example 2, after forming the low reflective layer 15 (TaHfON film), the reflectance on the surface of the low reflective layer against the light for inspection of a pattern was measured. As a result, the reflectance on the surface of the protective layer 13 was 60.0%, and the reflectance on the surface of the low reflective layer 15 (TaHfON film) was 1.8%. Using such results and the above-mentioned formula, the contrast was obtained and found to be 94.1%.

With respect to the obtained EUV mask blank, the reflectance against EUV light was measured by irradiating the surface of the low reflective layer 15 (TaHfON film) with EUV light (wavelength: 13.5 nm). As a result, the reflectance against EUV light was 0.4%, whereby it was confirmed that the mask blank was excellent in the EUV absorption characteristic.

Further, the etching characteristic of the absorber layer (TaHf film) of the EUV mask blank obtained by the above procedure was evaluated as follows.

(6) Etching Characteristic

With respect to the etching characteristic, evaluation was carried out by the following method instead of evaluation by means of the EUV mask blank prepared by the above procedure.

On a test sample table (4 inch quartz base plate) of a RF plasma etching apparatus, a Si chip (10 mm×30 mm) having a Ru film or a TaHf film deposited thereon by the following method, was set as a test sample. In this state, the Ru film or the TaHf film of the Si chip set on the test sample table was subjected to plasma RF etching under the following conditions.

Bias RF: 50 W
Etching time: 120 sec
Trigger pressure: 3 Pa
Etching pressure: 1 Pa
Etching gas: $Cl_2$/Ar
Gas flow rate ($Cl_2$/Ar):20/80 sccm
Distance between electrode substrates: 55 mm The film deposition of the Ru film was carried out under the following film deposition conditions by magnetron sputtering.

Film Deposition Conditions for Ru Film
Target: Ru target
Sputtering gas: Ar gas (gas pressure: 0.3 Pa)
Output: 150 W
Film deposition rate: 0.25 nm/sec
Film thickness: 2.5 nm The TaHf film was deposited by discharging a TaHf compound target in an Ar atmosphere by means of magnetron sputtering. Here, the film deposition was carried out under the following two types of conditions.

Film Deposition Conditions (1) for TaHf Film
Target: TaHf compound target (compositional ratio: Ta 55 at. %, Hf 45 at. %)
Sputtering gas: Ar gas (gas pressure: 0.3 Pa)
Applied electric power: 150 W
Film deposition rate: 0.29 nm/sec
Film thickness: 60 nm
Degree of vacuum before film deposition: $4 \times 10^{-6}$ Pa Film Deposition Conditions (2) for TaHf Film
Target: TaHf compound target (compositional ratio: Ta 45 at. %, Hf 55 at. %)
Sputtering gas: Ar gas (gas pressure: 0.3 Pa)
Applied electric power: 150 W
Film deposition rate: 0.35 nm/sec
Film thickness: 60 nm
Degree of vacuum before film deposition: $4 \times 10^{-6}$ Pa With respect to the Ru film and the TaHf films (1) and (2) deposited under the above conditions, the etching rates were obtained, and the etching selective ratios were obtained by the following formula.

Etching selective ratio=Etching rate of TaHf film/etching rate of Ru film

The etching selective ratios of the TaHf films (1) and (2) were as follows.

TaHf Film (1)
Etching rate of TaHf film: 19.8 (nm/min)
Etching rate of Ru film: 1.48 (nm/min)
Etching selective ratio: 13.3

TaHf Film (2)
Etching rate of TaHf film: 19.0 (nm/min)
Etching rate of Ru film: 1.48 (nm/min)
Etching selective ratio: 12.8

The etching selective ratio to the protective layer 13 is preferably at least 10, and each of the TaHf films (1) and (2) had a sufficient etching selective ratio. Further, the TaHf films (1) and (2) have etching rates which are high as compared with a TaBN film in Comparative Example 1 given hereinafter and thus are expected to have an effect to reduce a damage to the resist during etching. Further, due to the reduction of the damage to the resist, reduction of the film thickness of the resist is expected.

Example 3

In this Example, an EUV mask blank 1 was prepared wherein a low reflective layer 15 (TaHfO film) containing Ta, Hf and O was formed on an absorber layer 14.

In this Example, the procedure up to forming an absorber layer 14 on a protective layer 13 was carried out in the same manner as in Example 1. On an absorber layer 14, a low reflective layer (TaHfO film) containing Ta, Hf and O was formed by magnetron sputtering as a low reflective layer 15 against an inspection light having a wavelength of 257 nm. The compositional ratio (at. %) of the low reflective layer was measured in the same manner as in Example 1 and found to be Ta:Hf:O=40:20:40.

The film deposition conditions for the low reflective layer 15 (TaHfO film) were as follows.

Film Deposition Conditions for Low Reflective Layer 15 (TaHfO FILM)
Target: TaHf compound target (compositional ratio: Ta 55 at. %, Hf 45 at. %)
Sputtering gas: Mixed gas of Ar and $O_2$ (Ar: 70 vol %, $O_2$: 30 vol %, gas pressure: 0.3 Pa)
Applied electric power: 150 W
Film deposition rate: 0.43 nm/sec
Film thickness: 10 nm Evaluation of the contrast of the obtained low reflective layer 15 (TaHfO film) was carried out in the same manner as in Example 2. As a result, the reflectance on the surface of the protective layer 13 was 60.0%, and the reflectance on the surface of the low reflective layer 15 (TaHfO film) was 2.6%. The contrast was obtained by using such results and the above formula, and found to be 91.7%.

Further, the EUV light reflectance on the surface of the low reflective layer 15 (TaHfO film) was measured. As a result, the EUV light reflectance was 0.4%, whereby it was confirmed that the layer was excellent in the EUV absorption characteristic.

Comparative Example 1

Comparative Example 1 was carried out in the same manner as in Example 1 except that the absorber layer was a film of a nitride of a tantalum/hafnium alloy (TaHfN film). The TaHfN film was deposited under the following conditions by using a TaHf target (Ta:Hf=55 at. %:45 at. %).

Film Deposition Conditions for TaHfN Layer
Target: TaHf target (Ta:Hf=55 at. %:45 at. %)
Sputtering gas: Ar gas, $N_2$ gas (Ar: 75 vol %, $N_2$: 25 vol %, gas pressure: 0.3 Pa), Partial pressure of $N_2$ gas: 0.075 Pa
Applied electric power: 150 W
Film deposition rate: 0.36 nm/sec
Film thickness: 60 nm The compositional ratio (at. %) of the obtained TaHfN film was measured by the same method as in Example 1, whereby Ta:Hf:N=30:25:45.

The crystalline state of the obtained absorber layer (TaHfN film) is confirmed by an X-ray diffraction apparatus, whereby a sharp peak is observed among the obtained diffraction peaks, and thus, the crystalline state of the absorber layer (TaHfN film) is confirmed to be crystalline. Further, the surface roughness (rms) is 0.6 nm.

Comparative Example 2

Comparative Example 2 was carried out in the same manner as in Example 1 except that the absorber layer was a nitride of a tantalum/hafnium alloy (TaHfN film). Here, the TaHfN film was prepared under the following conditions using a TaHf target (Ta:Hf=55 at. %:45 at. %).

Film deposition conditions for TaHfN
Target: TaHf target (Ta:Hf=55 at. %:45 at. %)
Sputtering gas: Ar gas, $N_2$ gas (Ar: 37 vol %, $N_2$: 63 vol %, gas pressure: 0.3 Pa), partial pressure of $N_2$ gas: 0.19 Pa
Applied electric power: 150 W
Film deposition rate: 0.08 nm/sec
Film thickness: 60 nm The compositional ratio (at. %) of the obtained TaHfN film was measured by the same method as in Example 1, whereby Ta:Ha:N=28:22:50.

The crystalline state of the obtained absorber layer (TaHfN film) was confirmed by an X-ray diffraction apparatus, whereby no sharp peak was observed among the obtained diffraction peaks, and thus, the crystalline state of the absorber layer (TaHfN film) was confirmed to be of an amorphous structure or a fine crystalline structure. Further, the surface roughness (rms) was 0.3 nm.

The resistance value of the obtained absorber layer (TaHfN film) was measured in the same manner as in Example 1, and found to be 1.629 Ω·cm. Thus, the resistance value was large as compared with TaHf in Example 1. Further, in the same manner as in Example 2, TaHfON was film-deposited as a low reflective layer 15, and the reflectance of the pattern inspection light (wavelength: 257 nm) was evaluated, whereby the reflectance on the surface of the low reflective layer 15 was 10%, and the contrast to the surface of the protective layer 13 was 72%.

The etching rate of the obtained absorber layer (TaHfN film) was evaluated in the same manner as in Example 2, whereby the etching rate was 20 nm/min, and the etching selective ratio to the protective layer (Ru film) was 13.5.

Comparative Example 3

Comparative Example 3 was carried out in the same manner as in Example 1 except that the absorber layer was a nitride of a tantalum/hafnium alloy (TaHfN film). The TaHfN film was prepared under the following conditions using a TaHf target (Ta:Hf=55 at. %:45 at. %).

Film deposition conditions for TaHfN
Target: TaHf target (Ta:Hf=55 at. %:45 at. %)
Sputtering gas: Ar gas, $N_2$ gas (Ar: 25 vol %, $N_2$: 75 vol %, gas pressure: 0.3 Pa), partial pressure of $N_2$ gas: 0.23 Pa
Applied electric power: 150 W
Film deposition rate: 0.06 nm/sec
Film thickness: 60 nm The compositional ratio (at. %) of the obtained TaHfN film was measured in the same manner as in Example 1, whereby Ta:Ha:N=17:13:70.

The crystalline state of the obtained absorber layer (TaHfN film) was confirmed by an X-ray diffraction apparatus, whereby no sharp peak was observed among the obtained diffraction peaks, and thus, the crystalline state of the absorber layer (TaHfN film) was confirmed to be of an amorphous structure or a fine crystalline structure. Further, the surface roughness (rms) was 0.3 nm.

The resistance value of the obtained absorber layer (TaHfN film) was measured in the same manner as in Example 1, and found to be insulating with a range over (>1.9E+7Ω).

INDUSTRIAL APPLICABILITY

The EUV mask blank of the present invention has an absorber layer which has a low reflectance particularly in a wavelength region of EUV light and pattern inspection light and which is easy to control to have a desired layer composition and thickness, and thus, it is useful for the production of photomasks in the semiconductor industry. The photomask may be used to pattern a photoresist layer followed by etching exposed surfaces of an underlying surface such as a semiconductor material, a dielectric material or a metalization layer.

The entire disclosure of Japanese Patent Application No. 2007-021092 filed on Jan. 31, 2007 including specification, claims, drawings and summary is incorporated herein by reference in its entirety.

What is claimed is:

1. A reflective mask blank for EUV lithography, comprising:
a substrate;
a reflective layer formed on the substrate and configured to reflect EUV light; and
an absorber layer formed on the reflective layer and configured to absorb EUV light,
wherein the absorber layer comprises Ta and Hf, and in the absorber layer, a content of Hf is from 20 to 60 at. %, a content of Ta is from 40 to 80 at. %, and a content of N is from 0 to at most 35 at. %.

2. The reflective mask blank for EUV lithography according to claim 1, wherein in the absorber layer, a compositional ratio of Ta and Hf is Ta:Hf=7:3 to 4:6.

3. The reflective mask blank for EUV lithography according to claim 1, wherein the absorber layer has a total content of B, Si and Ge being 0 to at most 5 at. %.

4. The reflective mask blank for EUV lithography according to claim 1, wherein the absorber layer contains from 0.1 to 1.0 at. % of Zr.

5. The reflective mask blank for EUV lithography according to claim 1, wherein the crystalline state of the absorber layer is amorphous.

6. The reflective mask blank for EUV lithography according to claim 1, wherein the absorber layer has a surface roughness (rms) of at most 0.5 nm at its surface.

7. The reflective mask blank for EUV lithography according to claim 1, wherein the absorber layer has a thickness of from 50 to 200 nm.

8. The reflective mask blank for EUV lithography according to claim 1, further comprising a protective layer between the reflective layer and the absorber layer, and the protective layer is made of Ru or a Ru compound.

9. The reflective mask blank for EUV lithography according to claim 1, further comprising a low reflective layer formed on the absorber layer and configured to reduce reflectance of an inspection light for inspection of a mask pattern, the low reflective layer comprising Ta, Hf and O, and in the low reflective layer, a total content of Ta and Hf is from 30 to 80 at. %, a compositional ratio of Ta to Hf is from 8:2 to 4:6, and the content of O is from 20 to 70 at. %.

10. The reflective mask blank for EUV lithography according to claim 9, wherein in the low reflective layer, the compositional ratio of Ta to Hf is Ta:Hf=7:3 to 4:6.

11. The reflective mask blank for EUV lithography according to claim 1, further comprising a low reflective layer formed on the absorber layer and configured to reduce reflectance of an inspection light for inspection of a mask pattern, the low reflective layer contains Ta, Hf, O and N, and in the low reflective layer, a total content of Ta and Hf is from 30 to 80 at. %, a compositional ratio of Ta to Hf is Ta:Hf=8:2 to 4:6, a total content of N and O is from 20 to 70 at. %, and a compositional ratio of N to O is N:O=9:1 to 1:9.

12. The reflective mask blank for EUV lithography according to claim 11, wherein in the low reflective layer, the compositional ratio of Ta to Hf is Ta:Hf=7:3 to 4:6.

13. The reflective mask blank for EUV lithography according to claim 9, wherein the low reflective layer contains from 0.1 to 1.0 at. % of Zr.

14. The reflective mask blank for EUV lithography according to claim 9, wherein the low reflective layer has a surface roughness (rms) of at most 0.5 nm at its surface.

15. The reflective mask blank for EUV lithography according to claim 9, wherein the low reflective layer has a thickness of from 5 to 30 nm.

16. The reflective mask blank for EUV lithography according to claim 9, further comprising a protective layer to protect the reflective layer during formation of a pattern in the absorber layer, is formed between the reflective layer and the absorber layer, and a contrast between light reflected on surface of the protective layer and light reflected on surface of the low reflective layer at a wavelength of light for inspection of the pattern formed in the absorber layer, is at least 30%.

17. The reflective mask blank for EUV lithography according to claim 16, wherein the protective layer comprises one selected from the group consisting of Ru, a Ru compound, $SiO_2$ and CrN.

18. The reflective mask blank for EUV lithography according to claim 9, wherein the reflectance on a surface of the low reflective layer at a wavelength of light for inspection of the pattern formed in the absorber layer, is at most 15%.

19. The reflective mask blank for EUV lithography according to claim 1, wherein the absorber layer is formed by carrying out a sputtering method using a target made of a TaHf compound.

20. The reflective mask blank for EUV lithography according to claim 19, wherein the target made of a TaHf compound has a composition comprising Ta=30 to 70 at. % and Hf=70 to 30 at. %.

21. The reflective mask blank for EUV lithography according to claim 19, wherein the target made of a TaHf compound contains from 0.1 to 5.0 at. % of Zr.

22. The reflective mask blank for EUV lithography according to claim 9, wherein the low reflective layer is formed by carrying out a sputtering method using a target made of a TaHf compound in an atmosphere containing oxygen.

23. The reflective mask blank for EUV lithography according to claim 11, wherein the low reflective layer is formed by carrying out a sputtering method using a target made of a TaHf compound in an atmosphere comprising nitrogen and oxygen.

24. The reflective mask blank for EUV lithography according to claim 22, wherein the target made of a TaHf compound has a composition comprising Ta=30 to 70 at. % and Hf=70 to 30 at. %.

25. The reflective mask blank for EUV lithography according to claim 23, wherein the target made of a TaHf compound has a composition comprising Ta=30 to 70 at. % and Hf=70 to 30 at. %.

26. The reflective mask blank for EUV lithography according to claim 22, wherein the target made of a TaHf compound contains from 0.1 to 5.0 at. % of Zr.

27. The reflective mask blank for EUV lithography according to claim 23, wherein the target made of a TaHf compound contains from 0.1 to 5.0 at. % of Zr.

28. A photomask comprising:
a substrate;
a reflective layer formed on the substrate and configured to reflect EUV light; and
a patterned absorber layer formed on the reflective layer and configured to absorb EUV light,
wherein the absorber layer comprises Ta and Hf, and in the absorber layer, a content of Hf is from 20 to 60 at. %, a content of Ta is from 40 to 80 at. %, and a content of N is from 0 to at most 35 at. %.

29. A method of patterning a surface comprising:
irradiating a photoresist layer overlying a surface through the photomask of claim 28;
developing said photoresist layer to form a patterned photoresist and exposing surfaces of said surface; and
etching said exposed surfaces of said surface.

* * * * *